United States Patent [19]
Ogawa et al.

[11] Patent Number: 6,102,649
[45] Date of Patent: Aug. 15, 2000

[54] TWO-ARMED TRANSFER ROBOT

[75] Inventors: Hironori Ogawa, Osaka; Ryusuke Tsubota, Sakai, both of Japan

[73] Assignee: Daihen Corporation, Osaka, Japan

[21] Appl. No.: 09/211,075

[22] Filed: Dec. 14, 1998

[30] Foreign Application Priority Data

Dec. 26, 1997 [JP] Japan ................................ 9-368399

[51] Int. Cl.⁷ .................................................. B25J 18/00
[52] U.S. Cl. ................................. 414/744.5; 74/479.01; 901/15; 414/917
[58] Field of Search .................... 414/744.5, 744.6, 414/744.1, 917; 901/15, 8; 74/479.01

[56] References Cited

U.S. PATENT DOCUMENTS

| | | |
|---|---|---|
| 5,083,869 | 1/1992 | Nakata et al. . |
| 5,151,008 | 9/1992 | Ishida et al. . |
| 5,333,986 | 8/1994 | Mizukami et al. . |
| 5,421,695 | 6/1995 | Kimura . |
| 5,439,547 | 8/1995 | Kumagai . |
| 5,584,647 | 12/1996 | Uehara et al. . |
| 5,636,963 | 6/1997 | Haraguchi et al. . |
| 5,647,724 | 7/1997 | Davis, Jr. et al. . |
| 5,667,354 | 9/1997 | Nakazawa . |
| 5,713,717 | 2/1998 | Cho . |
| 5,725,352 | 3/1998 | Tanaka . |
| 5,765,444 | 6/1998 | Bacchi et al. . |
| 5,813,823 | 9/1998 | Hofmeister . |

FOREIGN PATENT DOCUMENTS

| | | |
|---|---|---|
| 7-142552 | 6/1995 | Japan . |
| 8-71965 | 3/1996 | Japan . |

*Primary Examiner*—Donald W. Underwood
*Attorney, Agent, or Firm*—Merchant & Gould P.C.

[57] ABSTRACT

A two-armed transfer robot is provided which includes a first double-pantograph mechanism and a second double-pantograph mechanism which is substantially similar in arrangement to the first double-pantograph mechanism. Each double-pantograph mechanism includes a first pantograph assembly and a second pantograph assembly. The first pantograph assembly is provided with an inner link, a pair of first intermediate links and an outer link. The second pantograph assembly is provided with the outer link in common with the first pantograph assembly, a pair of second intermediate links and a hand-supporting link. The transfer robot also includes a stationary base member, first to fourth shafts coaxially supported by the base member for rotational movement about a vertical axis, first to fourth driving devices for actuating the first to the fourth shafts, respectively. The driving devices are fixed to the base member. The transfer robot further includes first and second handling members supported by the hand-supporting links of the first and the second double-pantograph mechanisms, respectively. The first and the second intermediate links of each double-pantograph mechanism is inclined beyond the vertical axis in a direction opposite to the handling member when the handling member is retreated closer to the shafts.

3 Claims, 16 Drawing Sheets

TWO-ARMED TRANSFER ROBOT

BACKGROUND OF THE INVENTION

1. Field of the Invention

The present invention relates to a two-armed transfer robot useful for semiconductor manufacturing equipment, liquid crystal display processing equipment and the like. More particularly, the present invention relates to a two-armed transfer robot for transferring workpieces between processing chambers under a vacuum.

2. Description of the Related Art

In general, transfer robots are used for semiconductor manufacturing equipment, liquid crystal display processing equipment and the like. The robot has at least one arm mechanism provided with a handling member. An object to be processed or workpiece such as a silicon wafer is placed on the handling member. The arm mechanism is capable of moving horizontally in a straight line as well as rotating in a horizontal plane. A plurality of processing chambers for performing various kinds of processing are arranged around a rotation axis of the robot. With the use of the transfer robot, the workpiece is suitably brought to and taken away from a selected one of the processing chambers.

For improving efficiency in the transferring operation, use has been made of the so-called two-armed transfer robot having two arm mechanisms. Each arm mechanism has a free end at which a handling member is mounted.

Conventionally, various kinds of two-armed transfer robots have been proposed. One example of such transfer robots is disclosed in JP-A-No. 7(1995)-142552 for example.

The conventional robot disclosed in the above document is shown in FIGS. 15–18 of the accompanying drawings.

Specifically, the illustrated conventional robot includes a stationary base frame 80, an inner frame 81 and a first arm 82. The inner frame is rotatable about a vertical axis 01 relative to the base frame 80, while the first arm is rotatable about a first axis P1 extending in parallel to the axis 01. The inner frame 81 is caused to rotate by a driving device fixed to the base frame 80, while the first arm 82 is caused to rotate by another driving device fixed to the inner frame 81.

Reference numeral 83 indicates a second arm which is rotatable relative to the first arm 82 about a second axis Q1 (see FIG. 16) extending in parallel to the first axis P1, while reference numeral 84A indicates a handling member which is rotatable relative to the arm 83 about a third axis R1 extending in parallel to the second axis Q1. Reference numeral 85 indicates a first rotation-transmitting member which is fixed to the inner frame 81 coaxially with the first axis P1, while reference numeral 86 indicates a second rotation-transmitting member which is fixed to the second arm 83 coaxially with the second axis Q1. Reference numeral 87 indicates a third rotation-transmitting member fixed to the first arm 82 coaxially with the second axis Q1, while reference numeral 88 indicates a fourth rotation-transmitting member fixed to the handling member 84 coaxially with the third axis R1.

A first connecting member 89 is provided between the first rotation-transmitting member 85 and the second rotation-transmitting member 86, while a second connecting member 90 is provided between the third rotation-transmitting member 87 and the fourth rotation-transmitting member 88. The distance S between the first and second axes is equal to the distance between the third and fourth axes. The radius ratio of the first rotation-transmitting member 85 to the second rotation-transmitting member 86 is 2 to 1. The radius ratio of the fourth rotation-transmitting member 88 to the third rotation-transmitting member 87 is also 2 to 1.

Chain sprockets or pulleys may be used for the first to fourth rotation-transmitting members 85–88. Correspondingly, the first and second connecting members 89, 90 may be chains or timing belts.

A first arm mechanism 91 is made up of the above-mentioned elements 82–90. A second arm mechanism 92, which is symmetrical to the first arm mechanism with respect to the X—X line, is supported for rotation about the second axis P2 extending in parallel to the axis 01.

Thus, the distance between the axis 01 and the first axis P1 is equal to that between the axis C1 and the second axis P2. The two-armed transfer robot is made up of the above elements 80–92.

The operations of the first and the second arm mechanisms 91, 92 are symmetrical with respect to the X—X line and substantially the same. Therefore, description will only be made to the operation of the first arm mechanism 91.

First, it is assumed that the inner frame 81 is kept stationary relative to the base frame 80, and that the first, second and third axes P1, Q1, R1 are initially located on a common straight line, as shown in FIG. 17. Starting from this state, the first arm 82 is rotated counterclockwise through an angle θ about the first axis P1.

During the above operation, the first rotation-transmitting member 85 is held stationary, while the second axis Q1 is moved counterclockwise around the first axis P1 through the angle θ. (Thus, the second axis Q1 is shifted from the initial position to a position Q11.) As a result, a Y1-side portion of the first connecting member 89 is wound around the first rotation-transmitting member 85, whereas a Y2-side portion of the same member is unwound from the first rotation-transmitting member 85.

Thus, as shown in FIG. 17, the first connecting member 89 is moved in a direction indicated by arrows a1 and a2. As a result, the second rotation-transmitting member 86 is rotated clockwise about the second axis Q1.

As previously mentioned, the radius ratio of the first rotation-transmitting member 85 to the second rotation-transmitting member 86 is 2 to 1. Thus, when the first arm 82 is rotated counterclockwise about the first axis P1 through the angle θ, the second rotation-transmitting member 86 is rotated clockwise about the second axis Q11 through an angle 2θ.

At that time, since the second rotation-transmitting member 86 is fixed to the second arm 83, the second rotation-transmitting member 86 and the second arm 83 are rotated clockwise about the second axis Q1 through an angle 2θ.

If the second arm 83 did not change its orientation relative to the first arm 82, the third axis would be brought to an R11 position shown by broken lines. In an actual operation, however, the second rotation-transmitting member 86 is rotated clockwise about the second axis Q11 through an angle 2θ. Therefore, the third axis R11 is moved clockwise about the second axis Q11 through the same angle 2θ, to be brought to the R12 position.

This means that, even after the first arm 82 is rotated counterclockwise about the first axis P1 through an angle θ, the third axis R12 is still on the straight line extending through the first and the third axis P1 and R1.

When the second arm 83 is rotated clockwise about the second axis Q11 through an angle 2θ, bringing the third axis R11 to the R12 position, a Y2-side portion of the second connecting member 90 is wound around the third rotation-transmitting member 87, whereas a Y1-side portion of the same member is unwound from the third rotation-transmitting member 87.

As a result, the second connecting member 90 will be shifted in a direction b1–b2 shown in FIG. 17. Thus, the fourth rotation-transmitting member 88 is rotated counterclockwise about the third axis R12.

When the second arm 83 is rotated clockwise about the second axis Q11 through an angle 2θ as described above, the fourth rotation-transmitting member 88 is rotated counterclockwise about the third axis R12 through an angle θ (the radius ratio of the fourth rotation-transmitting member 88 to the third rotation-transmitting member 87 is 2 to 1). As a result, a point C0 of the fourth rotation-transmitting member 88 is brought to a position C1 on the straight line passing through the first and the third axes P1, R12.

Upon rotation of the first arm 82 about the first axis P1 in the counterclockwise direction as described above, the first arm mechanism 91 is actuated in the X-direction. Accordingly, the handling member 84A is moved along the line passing through the first and the third axes P1, R1. During this operation, however, the handling member 84A does not change its attitude or orientation since it is fixed to the fourth rotation-transmitting member 88. (As stated above, the fourth rotation-transmitting member 88 maintains its initial orientation during the above operation.)

Likewise, the second arm mechanism 92 is actuated in the X-direction, with the second handling member 84B keeping its initial attitude along the line passing through the first and the third axes P2, R2.

The first and the second handling members 84A, 84B are arranged between the axes P1, P2 as viewed in the Y1–Y2 direction (FIG. 17). Further, the extremities of the handling members 84A, 84B are vertically spaced from each other. Thus, upon actuation of the arm mechanisms 91, 92, the handling members 84A, 84B can move along the X—X line passing through the axis 01 without interfering with each other.

When the inner frame 81 is rotated about the axis 01, the first and the second arm mechanisms 91, 92 are simultaneously rotated about the axis 01.

As shown in FIG. 18, a suitable number of processing chambers (six chambers, in the figure) are arranged around the axis 01 of the two-armed transfer robot. Workpieces are transferred by the robot to these chambers 71–76.

The conventional transfer robot has been found disadvantageous in the following respects.

First, as shown in FIGS. 15–18, the axis P1 of the first arm mechanism 91 and the axis P2 of the second arm mechanism 92 are spaced from each other, with the axis 01 of the inner frame 81 located therebetween. This arrangement renders the rotation radius of the inner frame 81 unfavorably large.

Accordingly, the bearings 93 provided around the inner frame 81 need to have an unfavorable large diameter. The magnetic fluid seal 94 for hermetic sealing suffers the same problem. With the use of such bearings and magnetic fluid seal, the overall size of the robot will be unfavorably large, so that the robot will become unduly expensive.

Another problem is that the driving devices for moving the handling members 84A, 84B are mounted on the inner frame 81. With such an arrangement, in operation, the driving devices are rotated together with the inner frame 81. However, in the conventional transfer robot, use is made of a cable extending from the base frame 80 for supplying the driving devices with electricity. Thus, in order to prevent breakage of the cable, it is necessary to stop the rotation of the inner frame 81 before it has been rotated too many times (more than 540° for example) in the same direction.

For controlling the rotation of the inner frame 81, the user of the conventional robot may rely on an additional monitor and controlling unit for example. However, such devices make the transfer robot additionally expensive. More importantly, the additional devices merely serve to restrict the operational freedom of the transfer robot but cannot allow the user to operate the transfer robot freely.

Further, in the conventional robot, the first arm mechanism 91 and the second arm mechanism 92 are arranged to move together (simultaneously) around the first axis 01 upon rotation of the inner frame 81. Such an operation gives rise to the following inconvenience.

Referring to FIG. 18, it is assumed that a plurality of silicon wafers to be processed are initially stored in the chamber 72. For subjecting the silicon wafers to a predetermined processing, each of the stored silicon wafers needs to be transferred from the storing chamber 72 to one of the chambers 71 and 73–76. For that purpose, first, the first and second arm mechanisms 91, 92 are actuated, so that workpieces will be shifted onto the handling members 84A and 84B from the storing chamber 72. The silicon wafer placed on the handling member 84A (called "first wafer" hereinafter) may be carried into the chamber 73 (a target chamber), while the silicon wafer placed on the other handling member 84B (called "second wafer" hereinafter) may be carried into the chamber 71 (another target chamber).

For transferring the first wafer to the chamber 73, the inner frame 81 is caused to pivot clockwise (as seen in FIG. 18) through a certain angle (say, 45 degrees), so that the handling member 84A is brought into facing relation to the chamber 73. (The time needed for the inner frame 81 to perform the above pivoting movement will be called "time T1" hereinafter.) Then, the first arm mechanism 91 is actuated to shift the first wafer into the chamber 73. (The time needed for the first arm mechanism 91 to perform the shifting operation will be called "time T2.")

After the first wafer has been properly placed in the chamber 73, the inner frame 81 is caused to pivot counterclockwise through a certain angle (say, 90 degrees) to bring the handling member 84B into facing relation to the chamber 71. Then, the second arm mechanism 92 is actuated to shift the second wafer into the chamber 71. (The time needed for the inner frame 81 to rotate through a certain angle for moving the arm mechanisms from the chamber 73 to the storing chamber 72 will be called "time T3.")

In the conventional transfer robot, during the above operation, the second wafer is simply placed on the handling member 84B (i.e., without being subjected to any processing procedure) for the abovedefined times T1, T2 and T3. This means that a certain length of idle time (the sum of the times T1, T2 and T3) has to unfavorably lapse before the processing for the second wafer can be started.

As can be seen, the above idle time will increase with the distance between the target chambers. In addition, the transferring operation may need to be performed many times a day (with respect to all of the target chambers 71 and 73–76). In that case, even if the idle time for each transfer operation is short, the total of the idle times may be unfavorably large.

In view of the problems described above, two-armed transfer robots capable of performing effective operations with less idle time have been conventionally sought for.

SUMMARY OF THE INVENTION

It is, therefore, an object of the present invention to provide a compact, inexpensive two-armed transfer robot which is easy to operate and capable of providing good productivity.

According to the present invention, there is provided a two-armed transfer robot comprising:

a first double-pantograph mechanism and a second double-pantograph mechanism which is substantially similar in arrangement to the first double-pantograph mechanism, each double-pantograph mechanism including a first pantograph assembly and a second pantograph assembly, the first pantograph assembly having an inner link, a pair of first intermediate links and an outer link associated with the inner link via the first intermediate links, the second pantograph assembly including the outer link in common with the first pantograph assembly, a pair of second intermediate links and a hand-supporting link associated with the outer link via the second intermediate links;

a stationary base member;

first to fourth shafts coaxially supported by the base member for rotational movement about a first axis extending vertically;

first to fourth driving devices for actuating the first to the fourth shafts, respectively, the driving devices being fixed to the base member;

rotation-transmitting mechanisms provided between the first and the second intermediate links of the respective double-pantograph mechanisms; and first and second handling members supported by the hand-supporting links of the first and the second double-pantograph mechanisms, respectively;

wherein one of the first intermediate links of the first double-pantograph mechanism is fixed to the first shaft for rotation about the first axis, one of the first intermediate links of the second double-pantograph mechanism being fixed to the second shaft for rotation about the first axis, the inner link of the first double-pantograph mechanism being fixed to the third shaft for rotation about the first axis, the inner link of the second double-pantograph mechanism being fixed to the fourth shaft for rotation about the first axis, the first intermediate links and second intermediate links of each double-pantograph mechanism being equal in length, the second pantograph assembly of each double-pantograph mechanism being offset away from the first axis with respect to the first pantograph assembly of said each double-pantograph mechanism, the first and the second handling members being vertically spaced from each other, the handling member of each double-pantograph mechanism being arranged to be spaced from the shafts when the handling member of said each double-pantograph mechanism is retreated closer to the shafts, while the first and the second intermediate links of said each double-pantograph mechanism being inclined beyond the first axis in a direction opposite to the handling member when the handling member is retreated closer to the shafts, the handling members being arranged not only to linearly move in horizontal lines passing through the first axis but to rotate around the first axis.

According to the present invention, since the first and the second intermediate links of said each double-pantograph mechanism are inclined beyond the first axis in a direction opposite to the handling member when the handling member is retreated closer to the shafts, the first and/or second handling members can be moved through a long distance (or stroke) between the retreated position (closer to the shafts) and a projecting or extended position (farther away from the shafts).

According to a preferred embodiment, the transfer robot may further comprise a horizontally extending cover member arranged between the first and the second handling members, each handling member being movable in a space defined by the cover member.

With the use of such a cover member, unfavorable small particles (such as dust) can be prevented from falling onto a lower double-pantograph mechanism from the upper double-pantograph mechanism.

Each of the first to the fourth shafts may be rotatably supported via a magnetic fluid seal for hermetic sealing.

Other objects, features and advantages of the present invention will become clearer from the following detailed description given with reference to the accompanying drawings.

DETAILED DESCRIPTION OF THE PREFERRED EMBODIMENTS

The preferred embodiments of the present invention will be described below with reference to the accompanying drawings.

Reference is first made to FIGS. 1A–10B which show a two-armed transfer robot according to a first embodiment of the present invention. The illustrated transfer robot includes a stationary base member 1 and first to fourth shafts 2–5. The shafts 2–5 are supported by the base member 1 via suitable bearings and caused to coaxially rotate about a first axis 01 which extends vertically. The base member 1 may be installed in a vacuum chamber V.C. For maintaining the vacuum condition in the vacuum chamber, magnetic fluid seals 6–9 are provided around the shafts 2–5.

The illustrated robot also includes first to fourth driving devices 11–14 for actuation of the shafts 2–5. Each driving device is associated with a corresponding shaft via a suitable speed reducer, a rotation-transmitting member such as a sprocket or a pulley for example, and a connecting member such as a chain or a timing belt.

Figure 3:
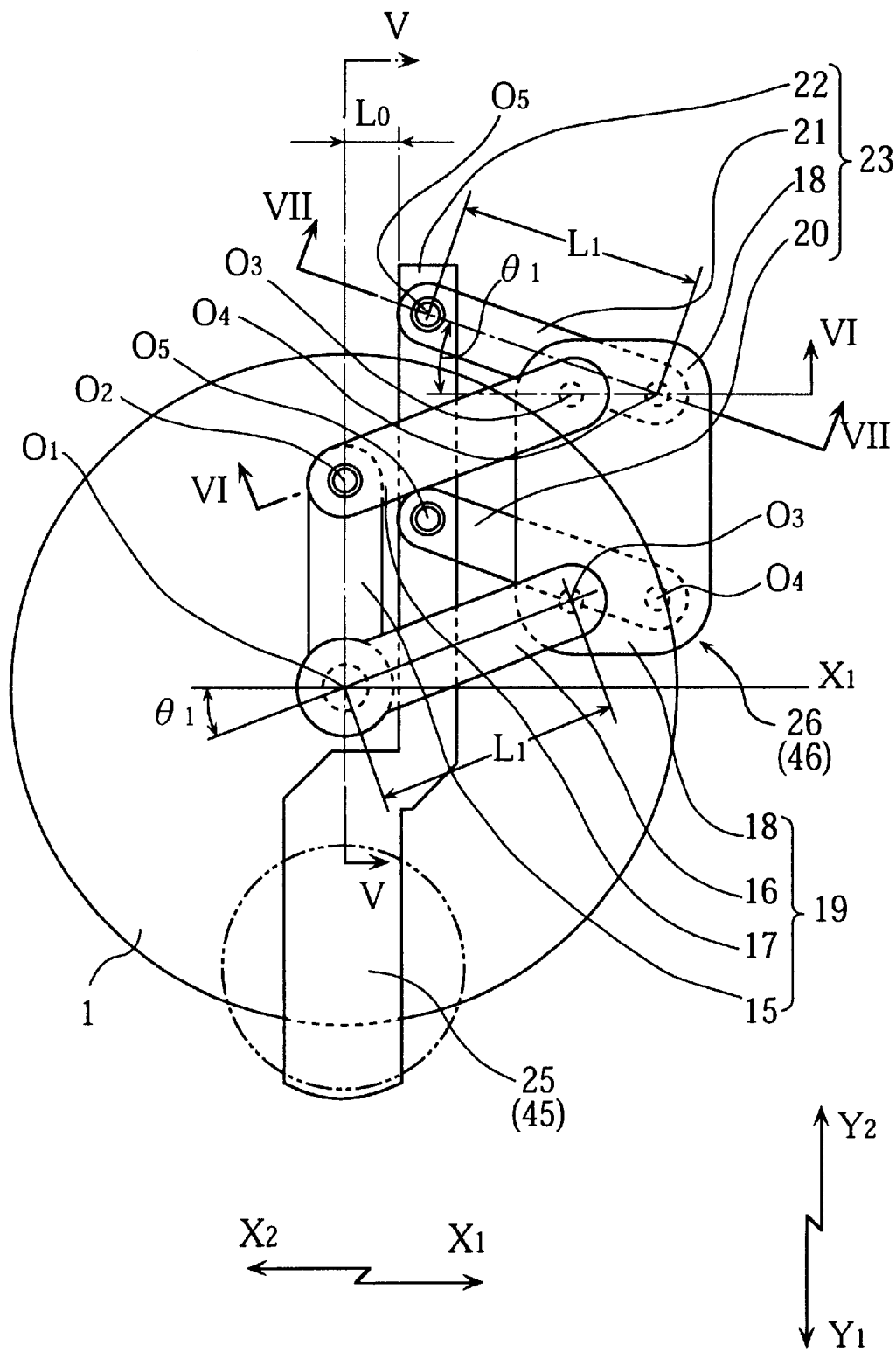
FIG. 3 is a plan view showing the transfer robot of FIG. 1.
Figure 4:
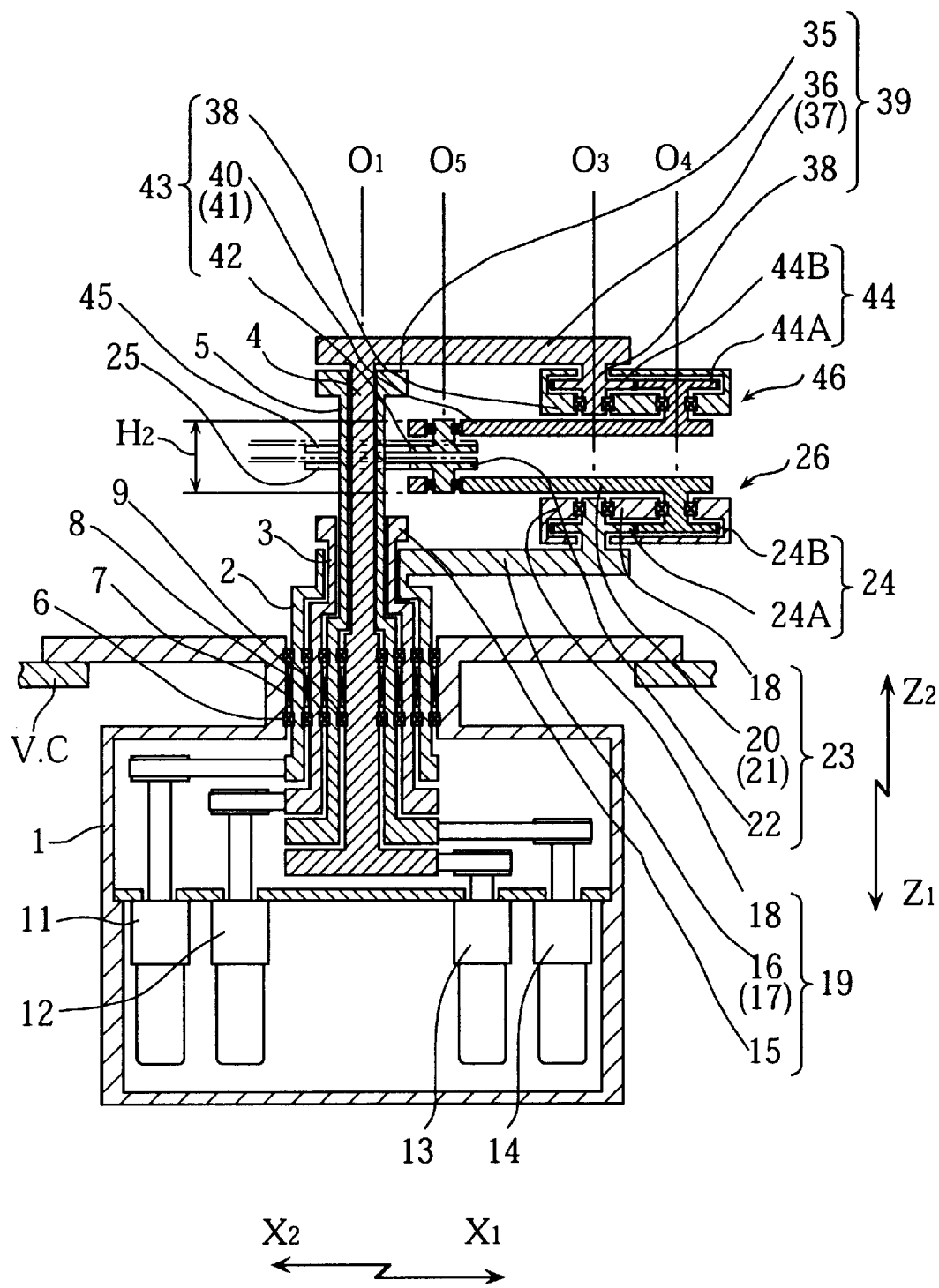
FIG. 4 is a sectional front view of the transfer robot of FIG. 1.
Figure 5:
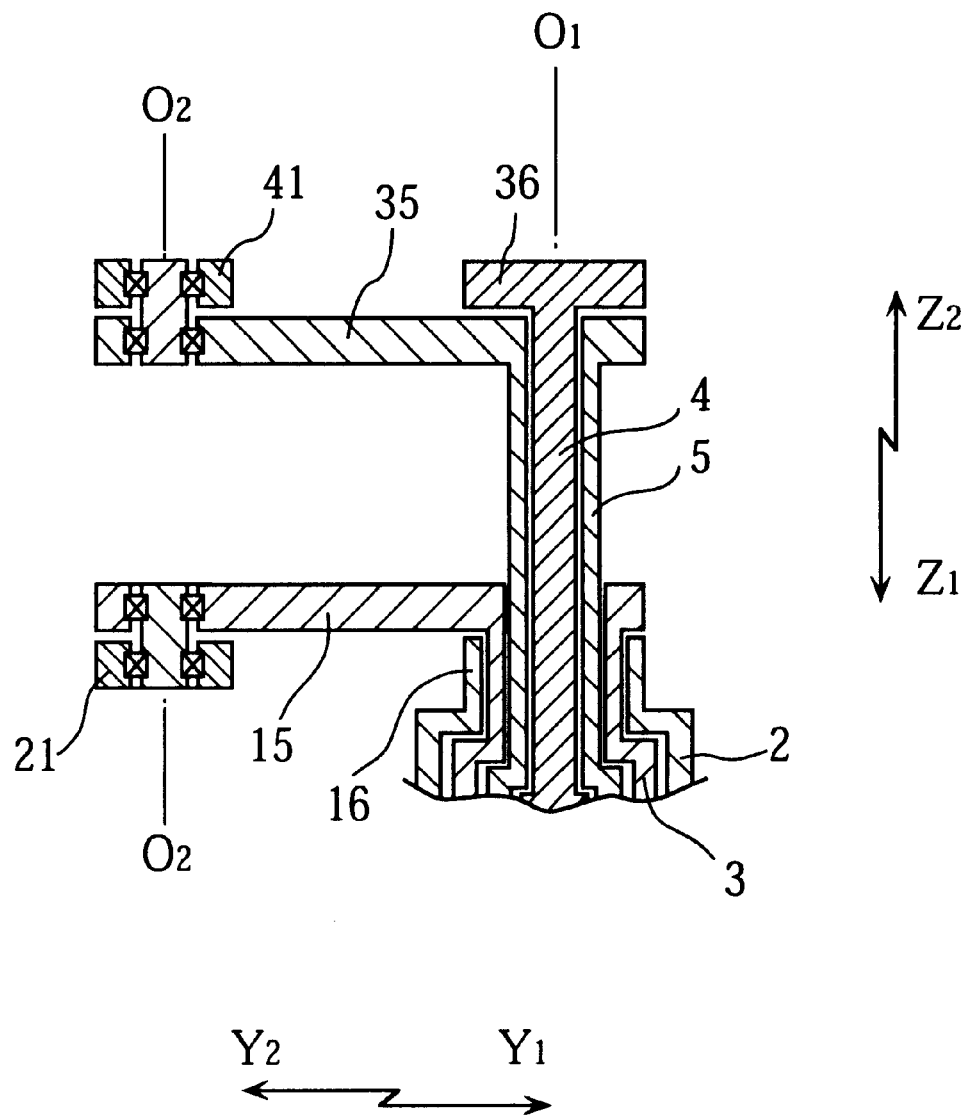
FIG. 5 is a sectional view taken along line s V—V in FIG. 3.
Figure 6:
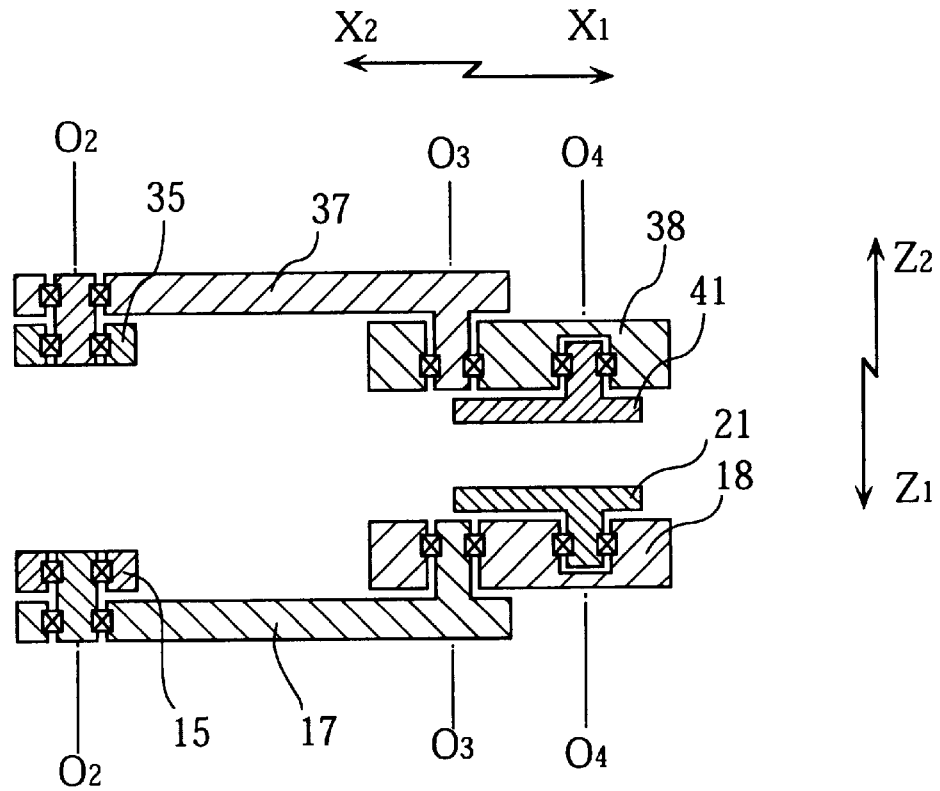
FIG. 6 is a sectional view taken along lines VI—VI in FIG. 3.
Figure 7:
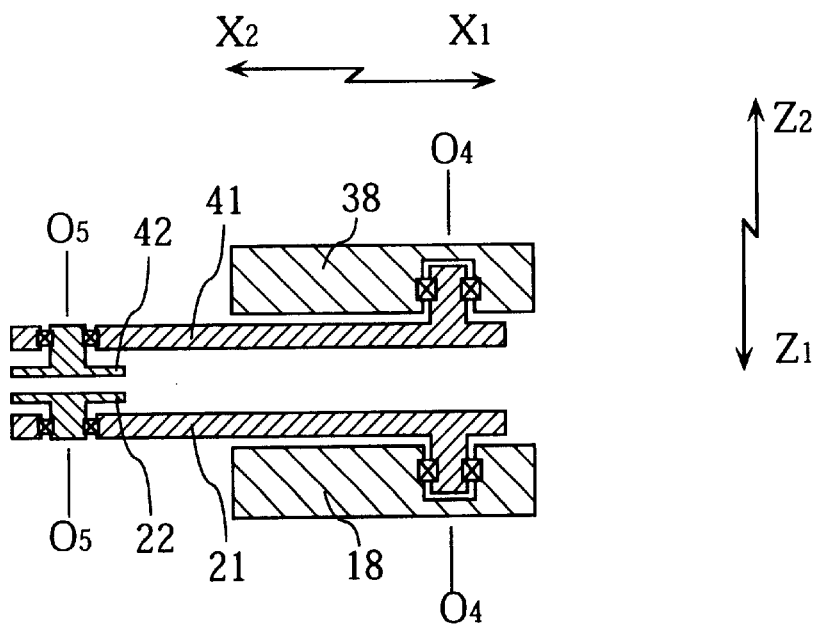
FIG. 7 is a sectional view taken along lines VII—VII in FIG. 3.

As shown in FIG. 3 for example, the illustrated transfer robot further includes a first pantograph assembly 19 made up of an inner link 15, a pair of first intermediate links 16, 17 and an outer link 18. Referring also to FIG. 4, the inner link 15 is fixed to the second shaft 3. An end of the first intermediate link 17 is connected to the inner link 15 for pivotal movement about a second axis 02, while the opposite end of the first intermediate link 17 is connected to the outer link 18 for pivotal movement about a third axis 03. An end of the first intermediate link 16 is fixed to the first shaft 2 driven by the first driving device 11, while the opposite end of the first intermediate link 16 is connected to the outer link 18 for pivotal movement about another third axis 03. Thus, upon actuation of the first driving device 11, the first intermediate link 16 is caused to pivot about the first axis 01.

Similarly, a second pantograph assembly 23 is made up of the outer link 18, a pair of second intermediate links 20, 21 and a hand-supporting link 22. Each of the second intermediate links 20, 21 has an end connected to the outer link 18 for pivotal movement about a fourth axis 04, and the opposite end connected to the hand supporting link 22 for pivotal movement about a fifth axis 05. The second pantograph assembly 23 is offset in the X1-direction with respect to the first pantograph assembly 19. Thus, the line connecting the two fourth axes 04 is spaced from the line connecting the two third axes 03 in the X1-direction.

In the illustrated embodiment, the distance between the first axis 01 and the third axis 03 of the first intermediate link 16 (distance L1) is equal to the distance between the second axis 02 and the third axis 03 of the first intermediate link 17. The distance L1 is also equal to the distance between the fourth axis 04 and the fifth axis 05 of each second intermediate link.

Figure 8:
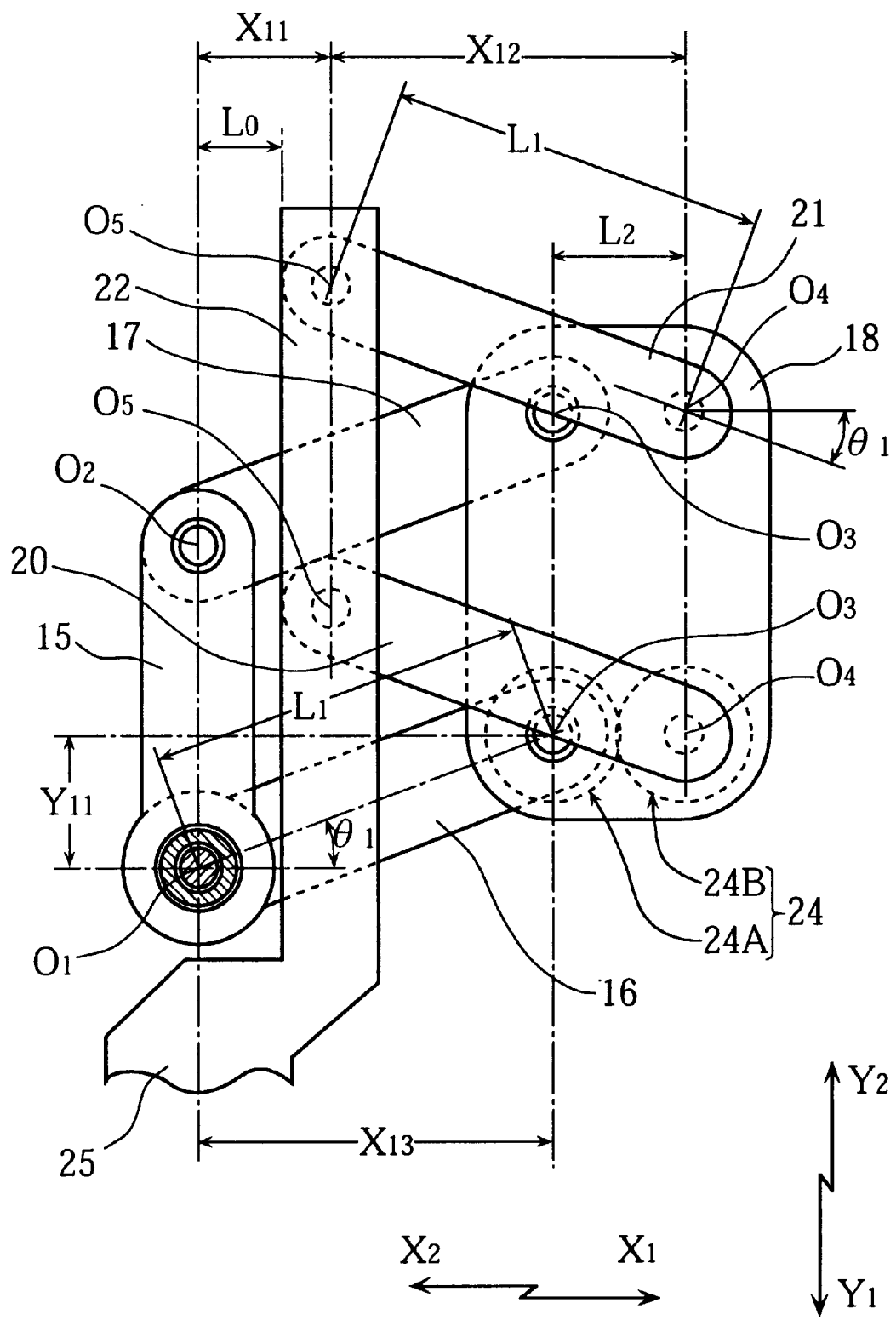
FIG. 8 is a plan view illustrating the operation of principal parts shown in FIG. 3.

A rotation-transmitting mechanism 24 is provided between the first intermediate link and the second intermediate link (see FIGS. 4 and 8). The rotation-transmitting mechanism 24 includes a first gear 24A fixed to the first intermediate link 16, and a second gear 24B fixed to the second intermediate link 20. The first and the second gears are arranged in mesh with each other.

The first and second pantograph assemblies and the rotation-transmitting mechanism 24 are associated with each other to form a first double-pantograph mechanism 26.

The robot also includes a second double-pantograph mechanism 46 having an arrangement which is substantially identical to that of the first double-pantograph mechanism 26. The second double-pantograph mechanism 46 is arranged above the first double-pantograph mechanism 26.

The second double-pantograph mechanism 46 includes a first pantograph assembly 39 which is made up of the inner link 35, a pair of first intermediate links 36, 37 and a second (outer) link 38. The mechanism 46 also includes a second pantograph assembly 43 which is made up of the outer link 38, a pair of second intermediate links 40, 41 and a hand-supporting link 42. The second pantograph assembly 43 is suitably offset with respect to the first pantograph assembly 39.

A rotation-transmitting mechanism 44 is provided between the first intermediate link 36 and the second intermediate link 40. The rotation-transmitting mechanism 44 includes a first gear 44A fixed to the first intermediate link 36, and a second gear 44B fixed to the second intermediate link 40.

The inner link 35 and the first intermediate link 36 are pivotable about the first axis 01, while the other intermediate link 37 is pivotable about the second axis 02. The first and the second axes are spaced from each other in the Y-direction.

Like in the first double-pantograph mechanism 26, the intermediate link 36 is connected to the third shaft 4, while the inner link 35 is connected to the fourth shaft 5.

The second double-pantograph mechanism 46 is made up of the first pantograph assembly 39, the second pantograph assembly 43 and the rotation-transmitting mechanism 44.

The hand-supporting link 22 of the first double-pantograph mechanism 26 carries a first handling member 25, while the hand-supporting link 42 of the second double-pantograph mechanism 46 carries a second handling member 45. The first and the second handling members 25, 45 are vertically spaced from each other. As will be described hereinafter, each handling member is actuated not only to linearly move along the horizontal line connecting the first and the second axes 01, 02, but to rotate around the first axis 01.

The illustrated transfer robot is made up of the elements 1–46 mentioned above. A suitable number of processing chambers (not shown) are arranged around the first axis 01 in a conventional manner.

Description will now be made to the operation of the first double-pantograph mechanism 26. As can be seen, the operation of the second double-pantograph mechanism 46 is similar to that of the first double-pantograph mechanism 26.

It is assumed that the straight line passing through the first and the third axes 01, 03 initially extends at an angle θ1, with respect to the X-direction, as shown in FIG. 8.

From the above initial position, upon actuation of the first driving device 11, the first shaft 2 and the first intermediate link 16 are rotated, clockwise for example as viewed from above, about the first axis 01 through an angle θ which is equal to (θ+θ2).

In the above case, it is further assumed that the second driving device 12 is not actuated, so that the inner link 15 (which is fixed to the second shaft 3) is held at rest.

When the first intermediate link 16 is rotated clockwise about the first axis 01 through the angle θ, the first pantograph assembly 19 is displaced in the Y1-direction with respect to the first and second axes 01 and 02.

In that case, as viewed about the third axis 03, the first intermediate link 16 is caused to rotate clockwise with respect to the outer link 18. Then, by the action of the rotation-transmitting mechanism 24, the second intermediate links 20, 21 are caused to rotate counterclockwise about the fourth axes 04 with respect to the outer link 18 through the angle θ. In this way, the second pantograph assembly 23 is caused to move in the Y1-direction with respect to the fourth axes 04.

During the above operation, the hand-supporting link 22 (and the first handling member 25) will be moved in the Y1-direction by a distance twice as great as the displacement of the first intermediate link 16.

Figure 9:
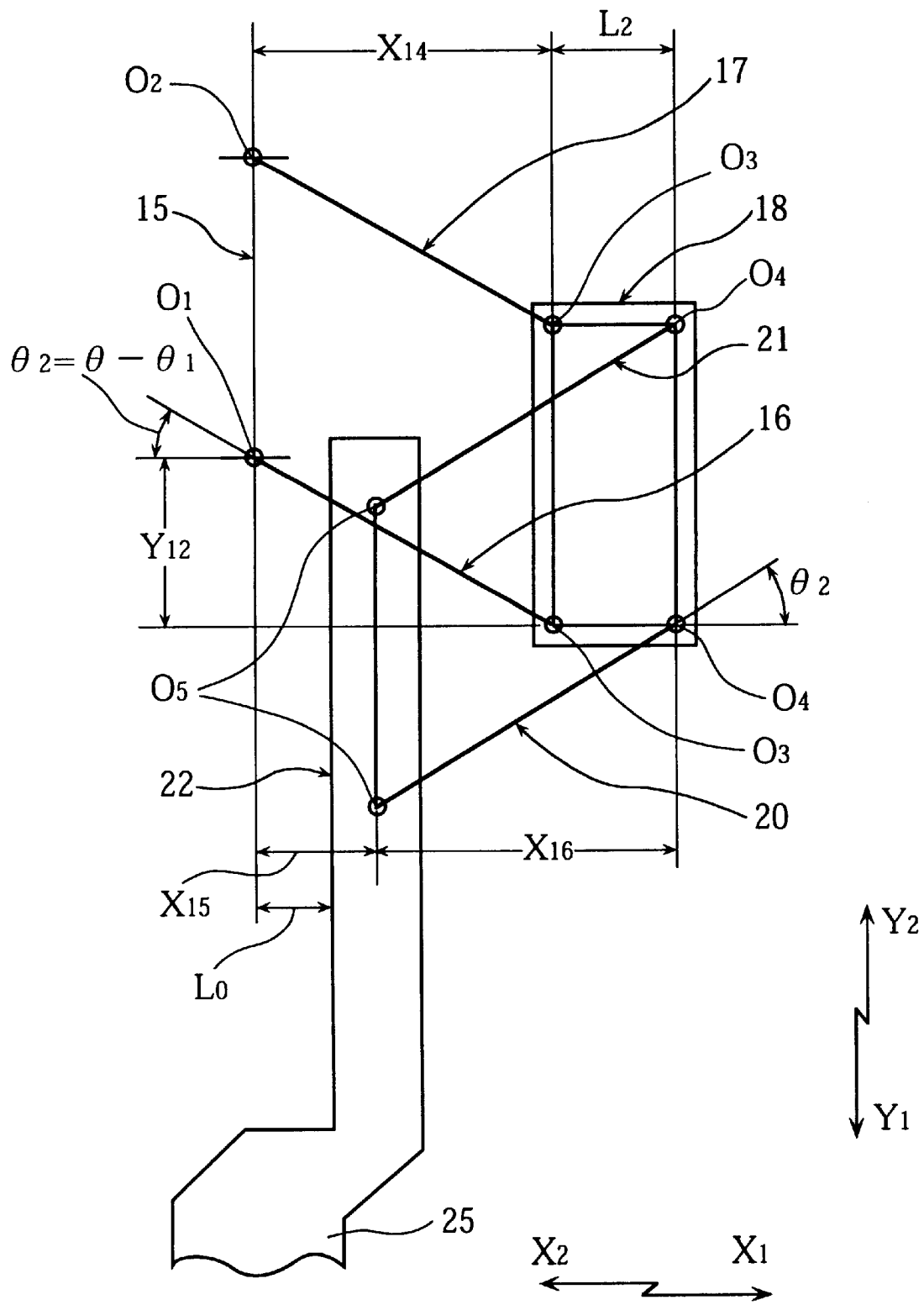
FIG. 9 is a planview illustrating the operation of the same principal parts.

More specifically, referring to FIGS. 8 and 9, the first intermediate link 16 (which is initially held in the position shown in FIG. 8) will be rotated clockwise about the first axis 01 through the angle θ (=θ1+θ2). Here, the first and second intermediate links 16, 17, 20, 21 have the same length L1, while the third and the fourth axes 03, 04 are spaced from each other by the distance L2 as viewed in the X-direction. Some other distances between the different axes are designated as X11–X16. Then, the following equations hold:

$$X12=X13=L1 \cos θ1,$$

$$X14=X16=L1 \cos θ2=L1 \cos(θ-θ1),$$

$$X13+L2=X12+X11, \text{ and}$$

$$X14+L2=X16+X15.$$

From the above relations, it can be known that X11=L2 and X15=L2. Therefore, X11=X15=L2.

Thus, when the first intermediate link 16 is caused to rotate (clockwise or counterclockwise) about the first axis 01, the hand-supporting link 22 (and the first handling member 25) will be linearly moved in the Y-direction along a constant line passing through the fifth axes 05. During that movement, the hand-supporting link 22 and the handling member 25 will maintain their initial orientation, while keeping a distance L0 with respect to the first axis 01.

Now, it is assumed that, as viewed in the Y-direction, the first and the third axes 01, 03 are initially spaced from each other by a distance Yii (FIG. 8), and that the distance between the same axes after the first intermediate link 16 has been rotated is Y12 (FIG. 9). In such an instance, the following equations hold:

$$Y11=L1 \sin θ1, \text{ and}$$

$$Y12=L1 \sin θ2=L1 \sin(θ-θ1).$$

Thus, upon rotation of the first intermediate link 16, the third axis 03 is displaced in the Y1-direction by a distance of (Y11+Y12).

When the first intermediate link 16 is rotated as stated above, the second intermediate links 20, 21 are rotated about the fourth axes 04 through the same angle. Thus, when the first intermediate link 16 is rotated clockwise about the first axis 01 through the angle θ, the handling member 28 will be displaced in the Y1-direction by a distance of 2×(Y11+Y12).

Figure 1A:
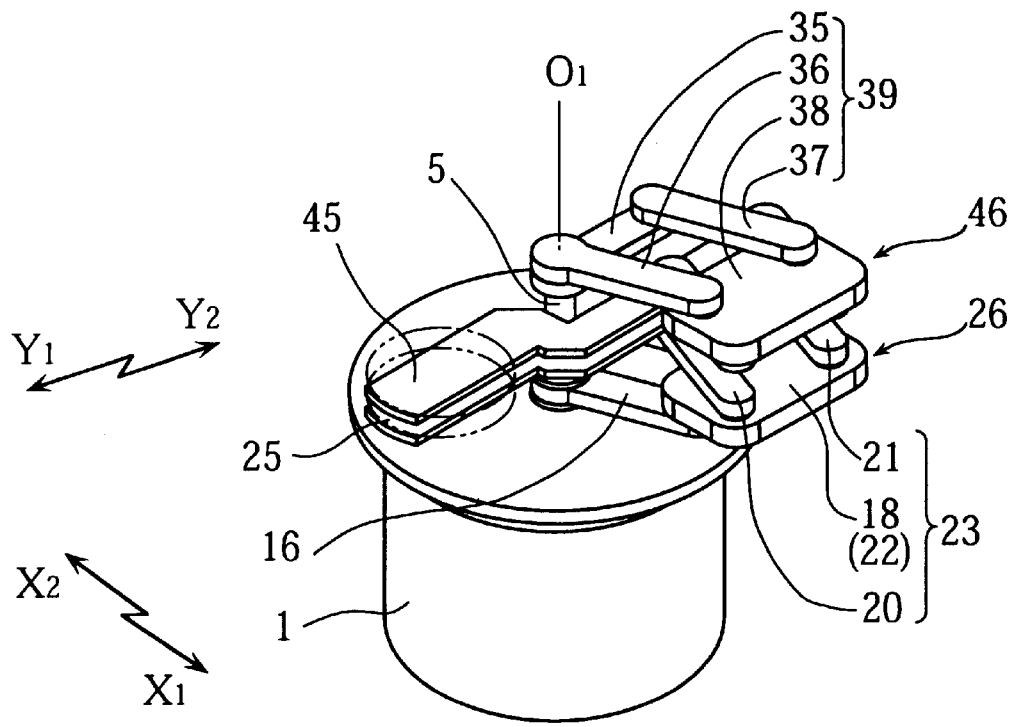
FIG. 1A is a perspective view showing a two-armed transfer robot according to a first embodiment of the present invention, wherein a first and a second double-pantograph mechanisms are folded in preparation for a rotational movement.
Figure 1B:
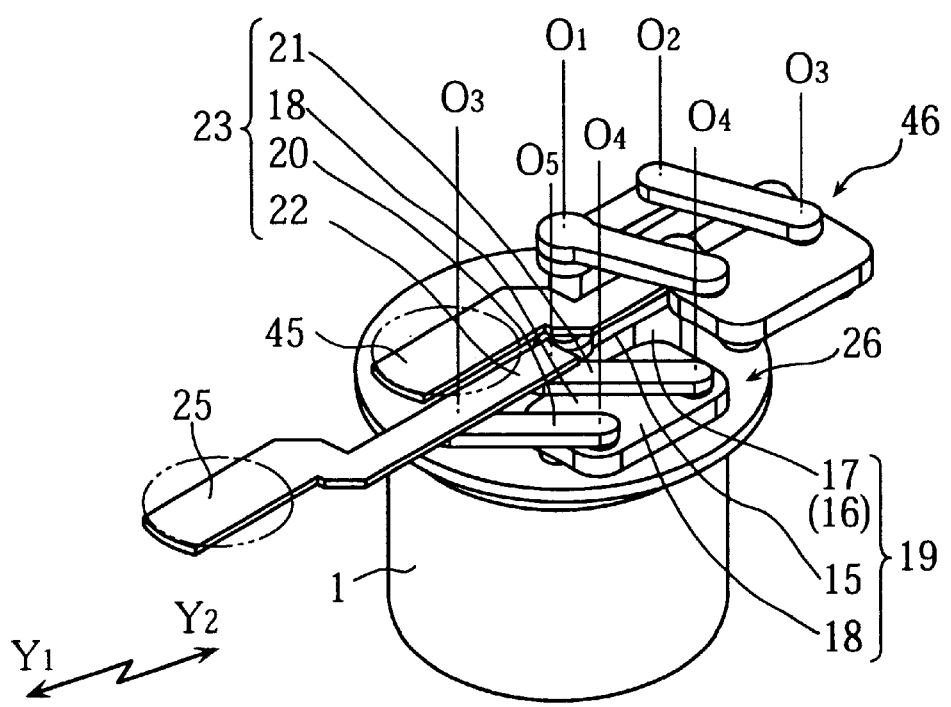
FIG. 1B is a perspective view showing the transfer robot of FIG. 1, wherein a first handling member is in motion by the action of the first double-pantograph mechanism.
Figure 2:
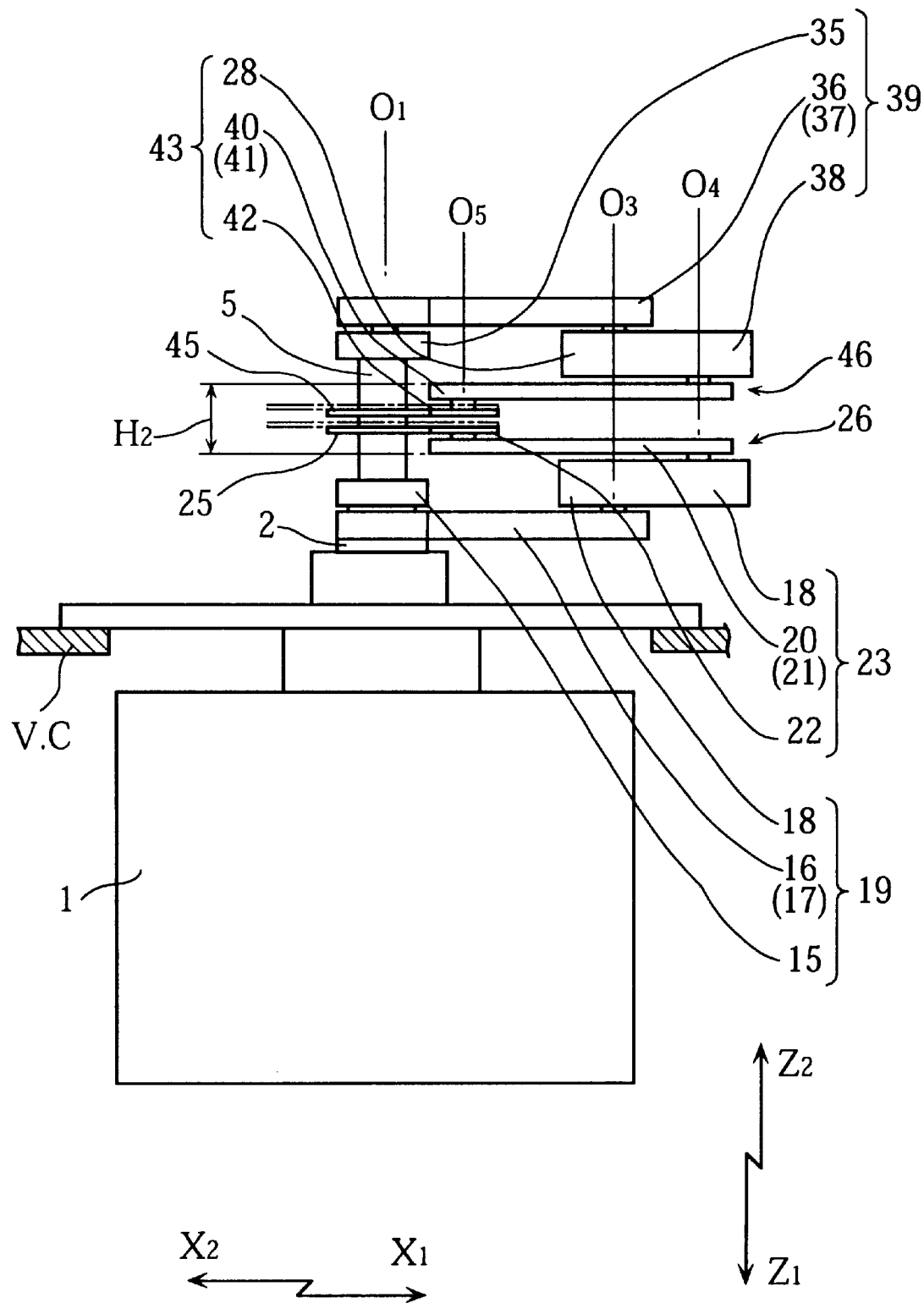
FIG. 2 is a front view showing the transfer robot of FIG. 1.

As shown in FIG. 1B for example, after the first handling member 25 has been fully extended outwardly, a workpiece will be shifted onto or away from the first handling member 25.

After the shifting of the workpiece is completed, the first double-pantograph mechanism 26 is folded or retreated inwardly, bringing the first handling member 25 closer to the first axis 01, as illustrated in FIG. 1A. In the folded or retreated position, the first handling member 25 (and the second handling member 45) will be moved (revolved) around the first axis 01.

When the transfer robot takes the position shown in FIG. 1A, the first and the second driving devices 11, 12 will be synchronously actuated, so that the first and second shafts 2, 3 are caused to rotate at the same rate in the same direction. At this time, the first double-pantograph mechanism 26 as a whole (connected to the first and second shafts 2, 3) will be moved around the first axis 01 (clockwise or counterclockwise), with the first handling member 25 being kept adjacent to the first axis 01.

After the first handling member 28 has been moved around the first axis 01 through a predetermined angle, the first driving device 11 will be actuated. Then, by the action of the first double-pantograph mechanism, the first handling member 25 is moved outwardly to a position where the shifting of a workpiece can be performed.

As is easily understood, the second double-pantograph mechanism 46 will be operated in the same manner as the first double-pantograph mechanism 26.

Specifically, for bringing the second handling member 45 to a position where the shifting of a workpiece can be performed, the third driving device 13 will be actuated, while the fourth driving device 14 is kept at rest.

After the shifting of the workpiece has been completed, the second handling member 45 is moved inwardly toward the first axis 01, and positioned adjacent to the first axis 01. Then, the third and the fourth driving devices 13, 14 will be synchronously actuated to rotate the third and the fourth shafts at the same rate in the same direction. As a result, the second double-pantograph mechanism 46 as a whole will be moved around the first axis 01.

The second double-pantograph mechanism 46 is vertically spaced from the first double-pantograph mechanism 26 by a suitable distance. Thus, in operation, the first and the second double-pantograph mechanisms will not interfere with each other.

Figure 10A:
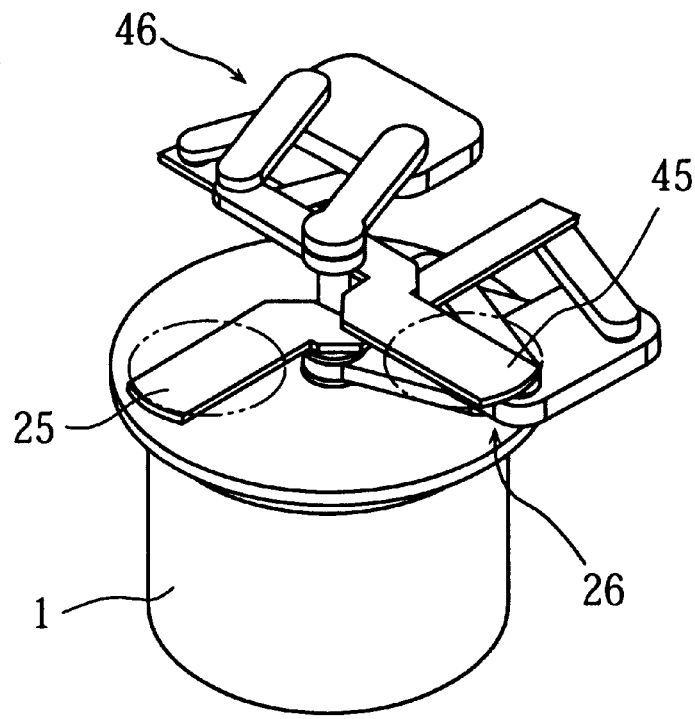
FIG. 10A is a perspective view showing the transfer robot of FIG. 1 in motion, wherein the second handling member is caused to pivot by the action of the second double-pantograph mechanism.

Initially the first and the second handling members 25, 45 may be held close to the first axis 01, as shown in FIG. 1A. Then, as shown in FIG. 10A, the second double-pantograph mechanism 46 for instance, will be moved around the first axis 01 counterclockwise through 90 degrees.

Figure 10B:
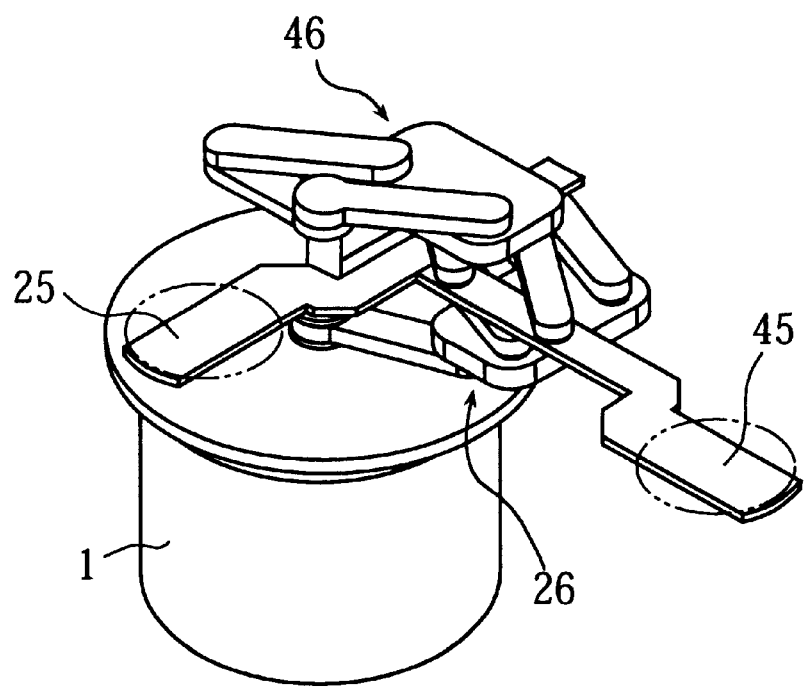
FIG. 10B illustrates the same transfer robot, wherein the second handling member is caused to move linearly by the action of the second double-pantograph mechanism.

Then, by the action of the second double-pantograph mechanism 46, the second handling member 45 is moved outwardly to a position shown in FIG. 10B. In that position, the shifting of a workpiece will be performed.

The first and the second handling members 25, 45 are appropriately spaced from each other in the vertical direction. Thus, even when they are operated independently, the first and the second handling members will not interfere with each other, nor with the double-pantograph mechanisms 26, 46.

As can be seen from FIG. 3, when the first and second handling members are in the retreated position, the inner end of the handling members is suitably spaced from the rotation shaft. Further, the outer ends of the respective first intermediate links are held at a position spaced away from the line 01-X1 in the Y2 direction. With such an arrangement, it is possible to cause the first intermediate links to pivot about the axes 01, 02 through large angles. At the same time, via the rotation-transmitting mechanism, the second intermediate links can be caused to pivot through the same angle about the fourth axes 04. In this way, the first and/or second handling members can be moved through a long distance (or stroke) between the retreated position and the projecting (or extended) position, in which the shifting of a workpiece is to be performed.

As state above, according to the first embodiment, the first and second handling members will be moved through a long distance. Besides, when the handling members are retreated to the inner position, they can be positioned as close to the rotation shafts as possible. Thus, the revolving radius of the transfer robot as a whole can be minimized. In other words, the transfer robot of the present invention can be made compact.

Further, there is no need to use conventionally needed rotation-transmitting members or connecting members for carrying hand-supporting members. Instead, according to the present invention, use is made of link mechanisms for holding the hand-supporting links. Such link mechanisms can be made small in the vertical dimension. Thus, the height $H_2$ shown in FIG. 2 will be minimized. Accordingly, each processing chamber can be provided with a small window for insertion of the handling members.

According to the first embodiment, in order to linearly move the handling member in a horizontal plane, the first and second intermediate links need to have the same length. As shown in FIG. 9, the second double-pantograph mechanism is offset outwardly from the first double-pantograph mechanism by the distance L2. Thus, in operation, the fifth axis 05 extending through the hand-supporting link can keep the same distance L2 (as viewed in the X-direction) with respect to the first axis 01. This means that the hand-supporting link can be linearly moved in a horizontal plane while being spaced from the first axis 01 by a constant distance.

According to the first embodiment, as stated above, the fifth axis 05 of the hand-supporting link is kept to be spaced from the first axis 01 by the constant distance L2. Thus, it is possible to arrange the first and the second double-pantograph mechanisms in the vertical direction.

Further, the first and the second handling members can be operated independently of each other by the driving devices 11–12 and the driving devices 13–14. Thus, workpieces carried by the first and the second handling members can be effectively shifted into desired processing chambers.

Further, the first to the fourth shafts 2–5 are coaxially supported for rotation about a common vertical axis. Thus, the bearings supporting the first to the fourth shafts 2–5 and the magnetic fluid seals 6–9 can be made small in diameter. Therefore, the transfer robot as a whole is advantageously made compact and inexpensive.

Further, unlike the conventional robot, the driving devices 11–14 of the present invention are fixed to the stationary base member 1. Thus, the power cable for supplying the driving devices with electricity does not break due to the rotation of the handling members. Such an arrangement makes it possible for the first and the second handling members to be rotated around the first axis Ol through any desired angle. Thus, the robot of the present invention is more conveniently used than the conventional robot, so that productivity will be improved. Further, the robot of the present invention is inexpensive since no additional devices for monitoring the rotation angle of the handling members are needed.

Figure 11:
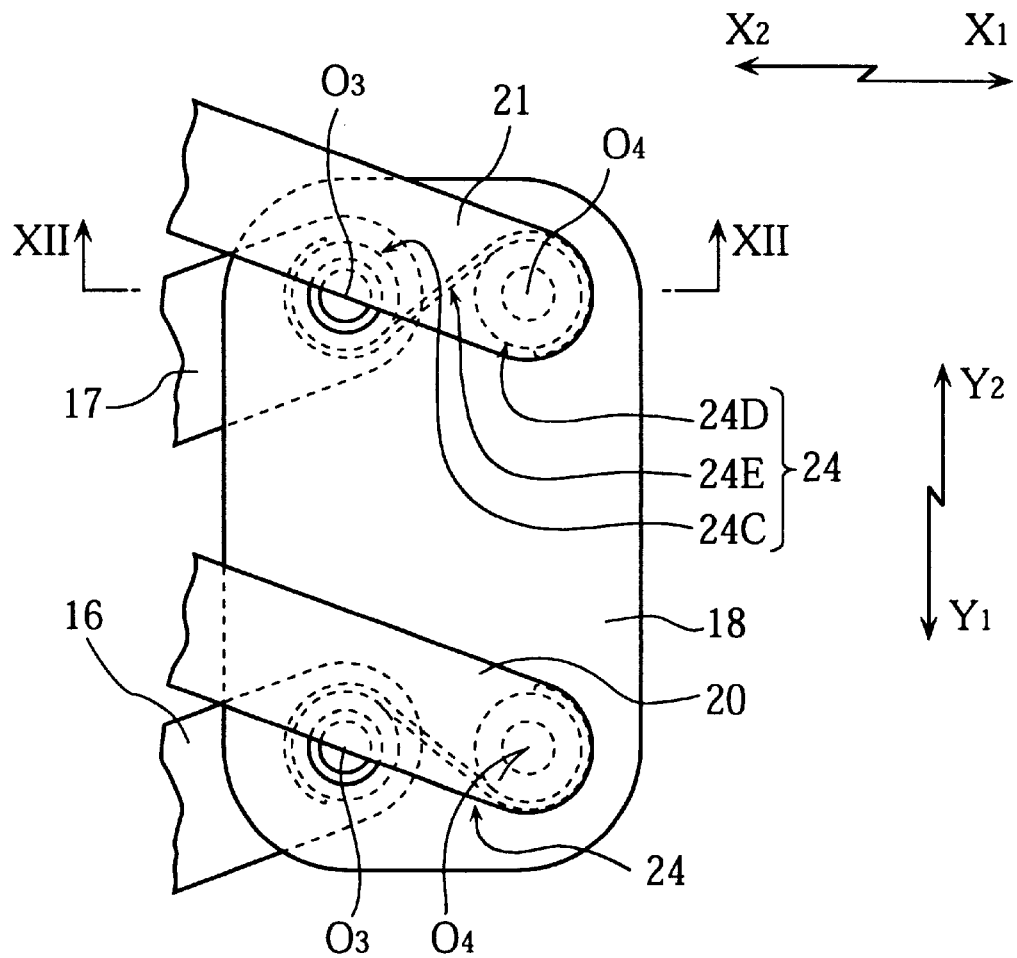
FIG. 11 is an enlarged plan view showing a modified version of principal parts shown in FIG. 3.
Figure 12:
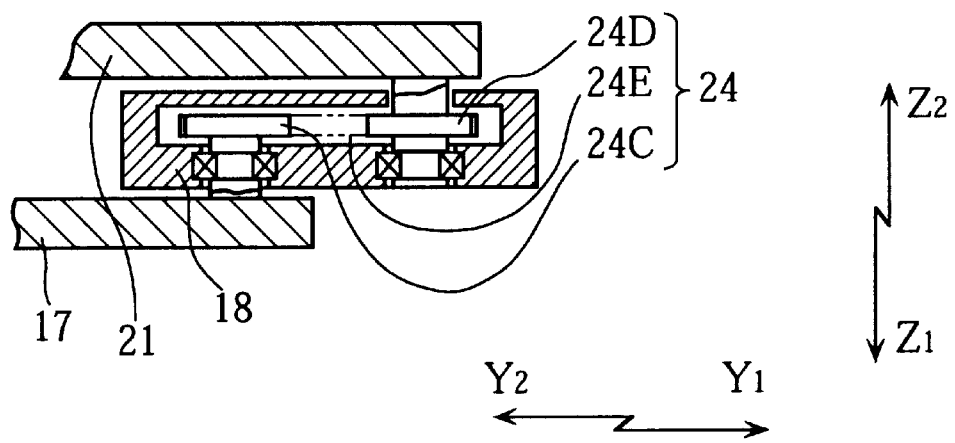
FIG. 12 is a sectional view taken along lines XII—XII in FIG. 11.

Referring to FIGS. 11 and 12, a modified rotation-transmitting mechanism 24 provided between the first and the second intermediate links 17,21 includes a pulley 24C attached to the first intermediate link 17, a pulley 24D attached to the second intermediate link 21 and a belt 24E extending between the above pulleys. The pulley 24C is concentric with the third axis 03, while the pulley 24D is concentric with the fourth axis 04. A similar rotation-transmitting mechanism is provided between the first intermediate link 16 and the second intermediate link 20.

Figure 13:
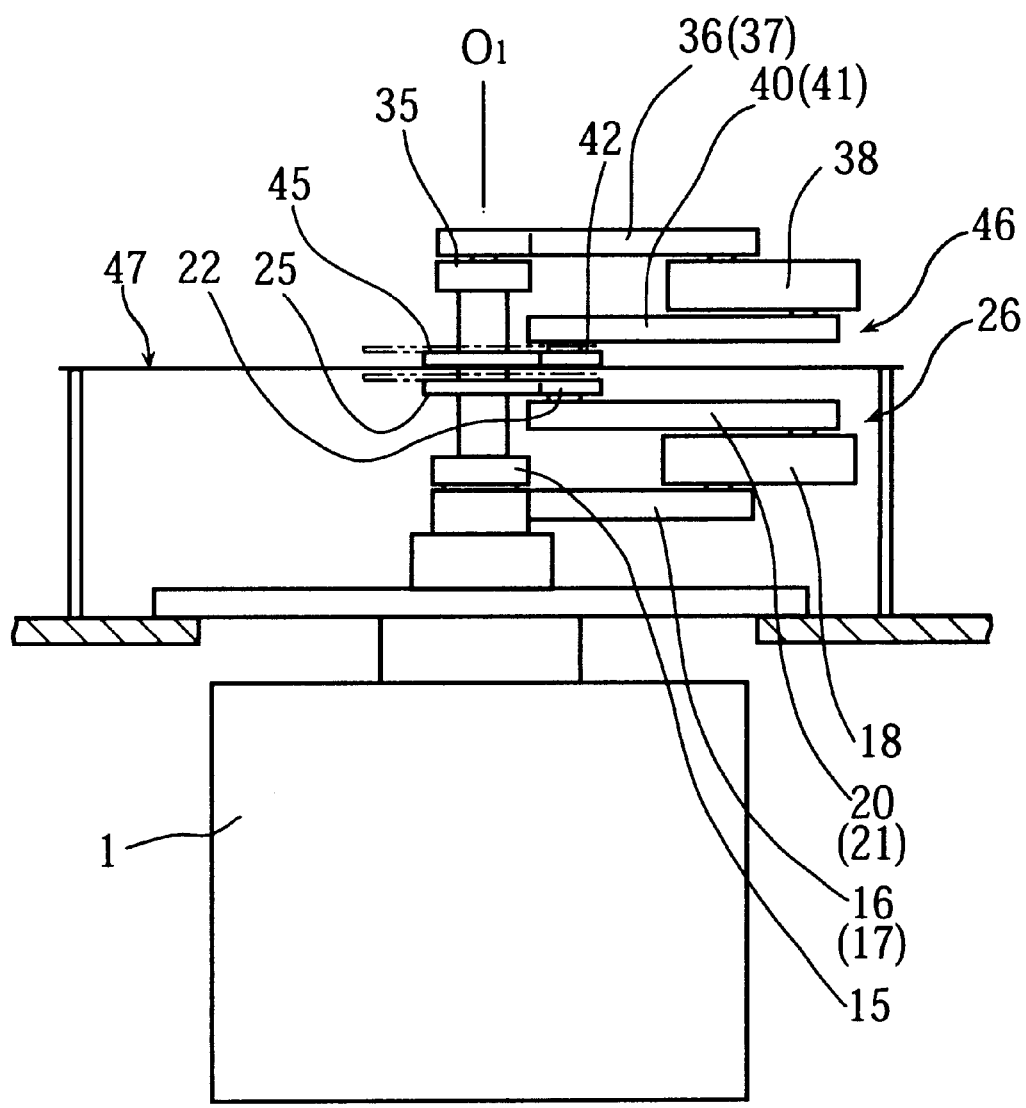
FIG. 13 is a front view showing a two-armed transfer robot according to a second embodiment of the present invention.
Figure 14:
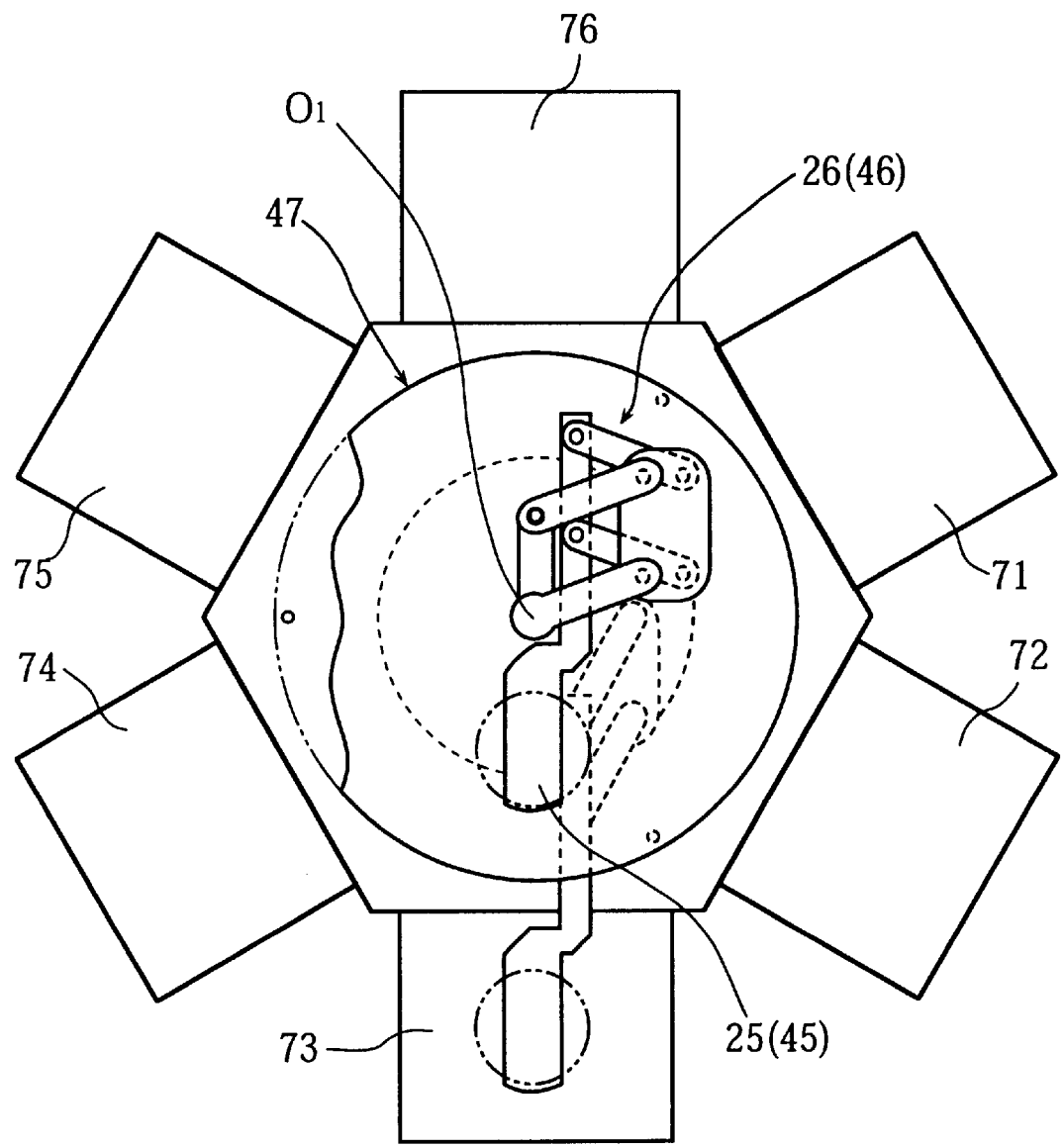
FIG. 14 is a plan view showing the transfer robot of FIG. 13.
Figure 15:
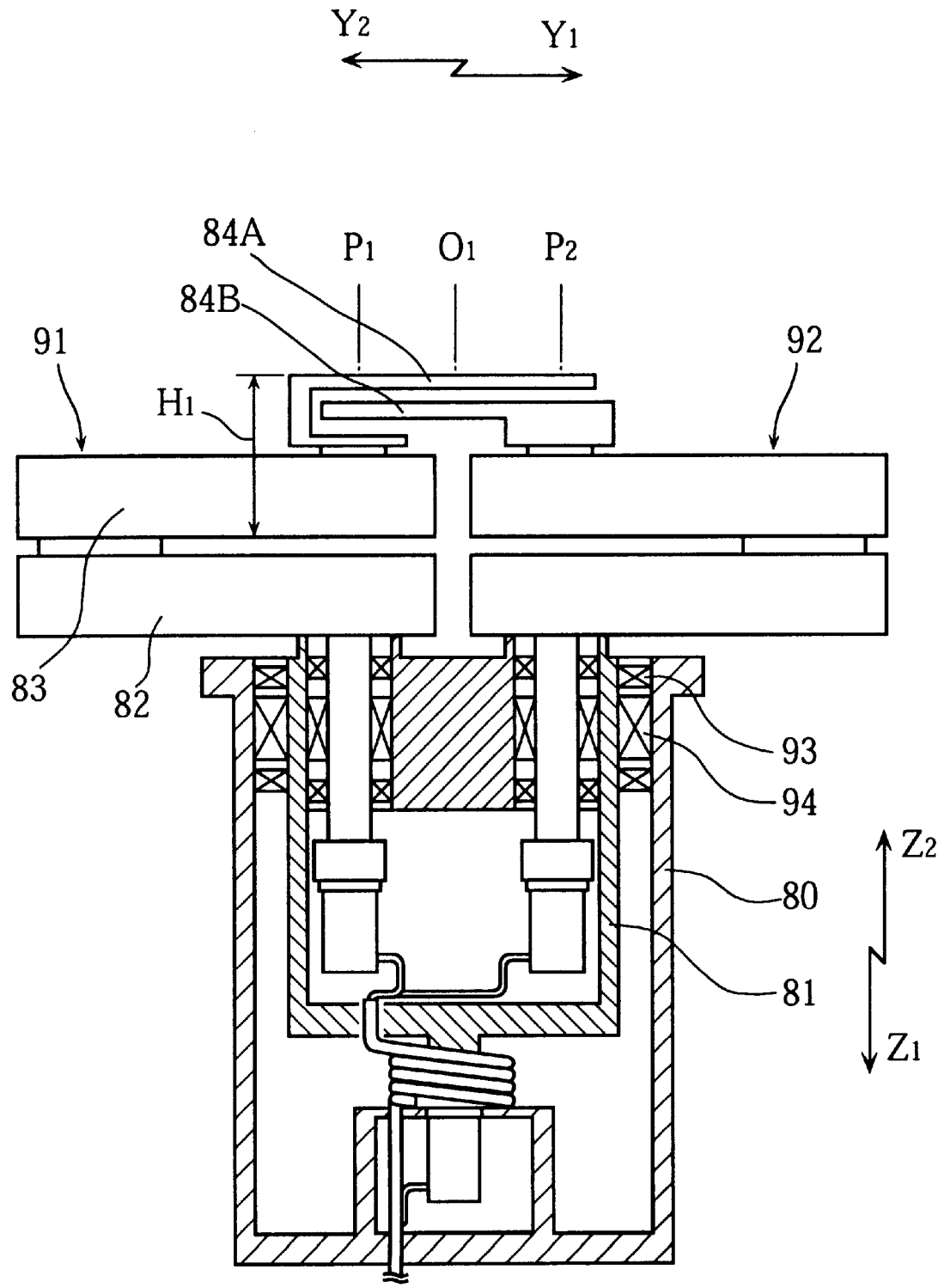
FIG. 15 is a sectional front view showing a conventional two-armed transfer robot.
Figure 16:
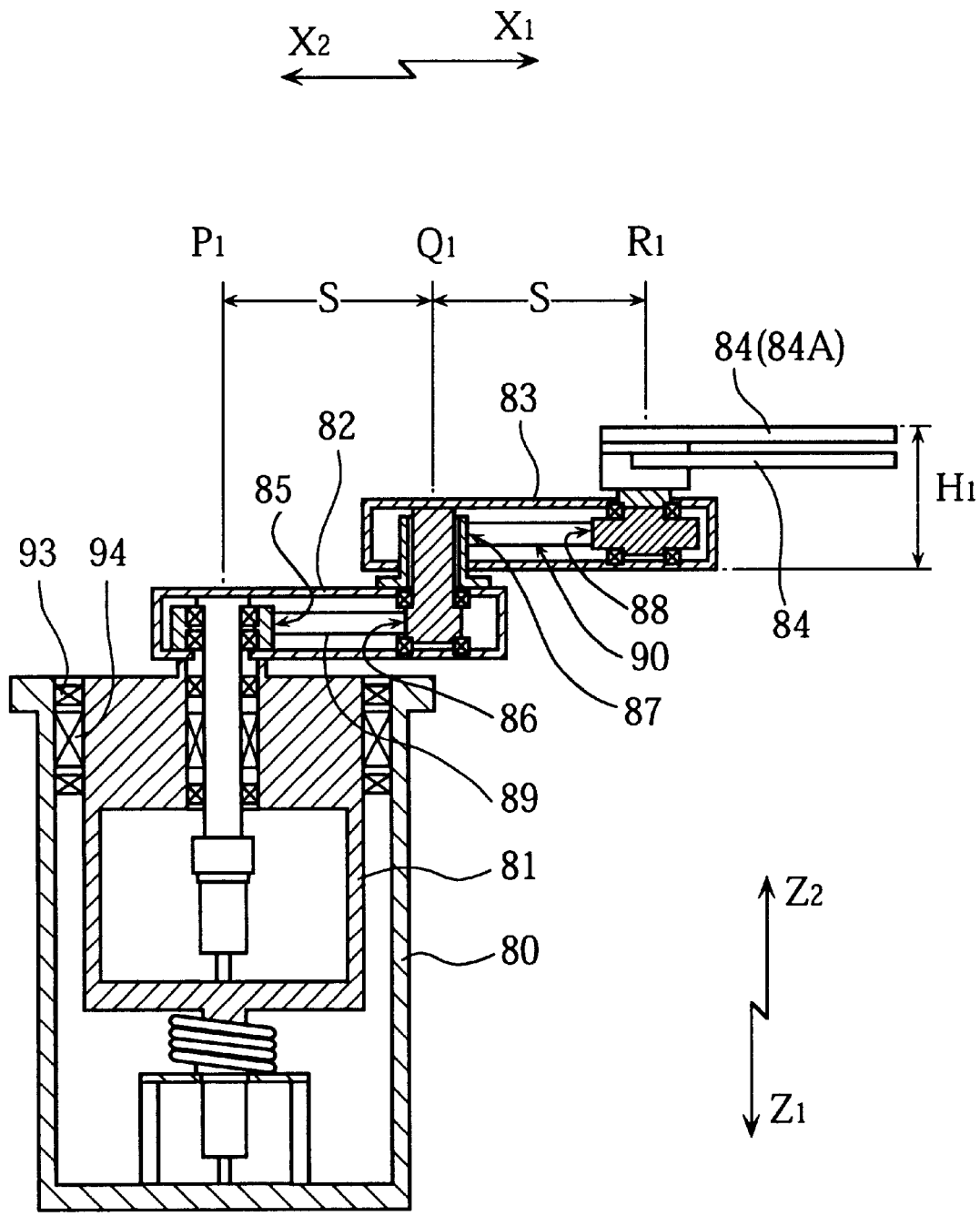
FIG. 16 is a sectional side view showing the transfer robot of FIG. 15.
Figure 17:
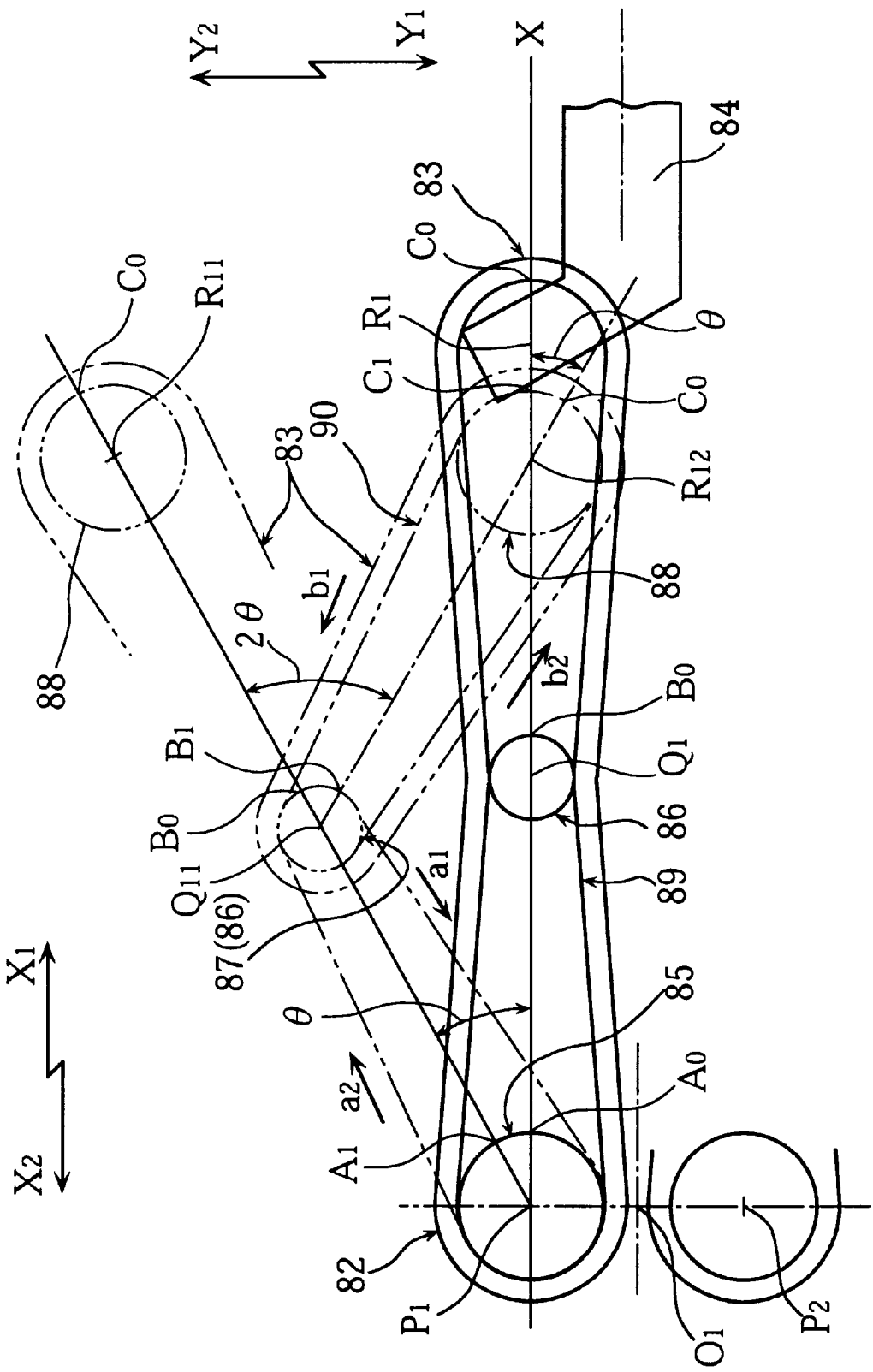
FIG. 17 is a plan view illustrating the movement of parts shown FIG. 15.
Figure 18:
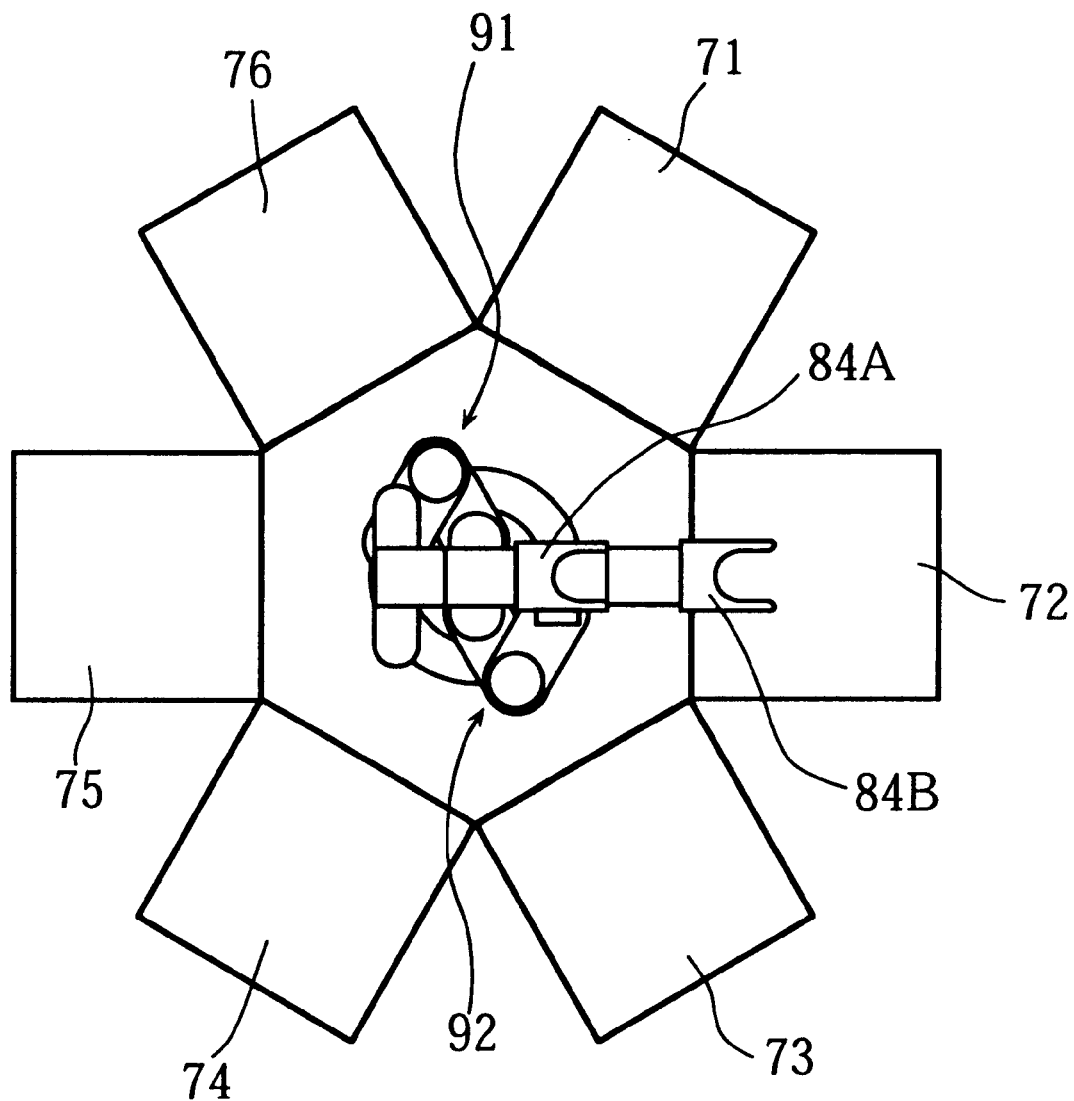
FIG. 18 is a plan view illustrating the transfer robot of FIG. 15 in operation.

FIGS. 13 and 14 show a two-armed transfer robot according to a second embodiment of the present invention. The illustrated transfer robot is basically similar to the transfer robot of the first embodiment except that use is made of a horizontally extending cover member 47 arranged between the first and second handling members 25, 45. The cover member 47 is formed with a central opening for allowing the passage of the vertical rotation shafts of the transfer robot. As is easily understood from FIG. 13, the first handling member 25 can be moved under the cover member 47 without being interfered with by the cover member, while the second handling member 45 can also be moved freely above the cover member 47.

With such an arrangement, it is possible to prevent small particles (such as dust) coming off the upper arm mechanism from falling onto the lower arm mechanism, in particular, onto a workpiece placed on the first handling member 25. Thus, the transfer robot of the second embodiment is advantageously used for a semiconductor manufacturing apparatus to be installed in a vacuum chamber.

The preferred embodiments of the present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A two-armed transfer robot comprising:
   a first double-pantograph mechanism and a second double-pantograph mechanism which is substantially similar in arrangement to the first double-pantograph mechanism, each double-pantograph mechanism including a first pantograph assembly and a second pantograph assembly, the first pantograph assembly having an inner link, a pair of first intermediate links and an outer link associated with the inner link via the first intermediate links, the second pantograph assembly including the outer link in common with the first pantograph assembly, a pair of second intermediate links and a hand-supporting link associated with the outer link via the second intermediate links;

a stationary base member;

first to fourth shafts coaxially supported by the base member for rotational movement about a first axis extending vertically;

first to fourth driving devices connected to the first to the fourth shafts for actuating the first to the fourth shafts, respectively, the driving devices being fixed to the base member;

rotation-transmitting mechanisms provided between the first and the second intermediate links of the respective double-pantograph mechanisms; and first and second handling members supported by the hand-supporting links of the first and the second double-pantograph mechanisms, respectively;

wherein one of the first intermediate links of the first double-pantograph mechanism is fixed to the first shaft for rotation about the first axis, one of the first intermediate links of the second double-pantograph mechanism being fixed to the second shaft for rotation about the first axis, the inner link of the first double-pantograph mechanism being fixed to the third shaft for rotation about the first axis, the inner link of the second double-pantograph mechanism being fixed to the fourth shaft for rotation about the first axis, the first intermediate links and second intermediate links of each double-pantograph mechanism being equal in length, the second pantograph assembly of each double-pantograph mechanism being offset away from the first axis with respect to the first pantograph assembly of said each double-pantograph mechanism, the first and the second handling members being vertically spaced from each other, the handling member of each double-pantograph mechanism being arranged to be spaced from the shafts when the handling member of said each double-pantograph mechanism is retreated closer to the shafts, while the first and the second intermediate links of said each double-pantograph mechanism being inclined beyond the first axis in a direction opposite to the handling member when the handling member is retreated closer to the shafts, the handling members being arranged not only to linearly move in horizontal lines passing through the first axis but to rotate around the first axis.

2. The transfer robot according to claim 1, further comprising a horizontally extending cover member arranged between the first and the second handling members, each handling member being movable in a space defined by the cover member.

3. The transfer robot according to claim 1, wherein each of the first to the fourth shafts is rotatably supported via a magnetic fluid seal for hermetic sealing.

* * * * *